US009831300B2

(12) United States Patent
Bae et al.

(10) Patent No.: US 9,831,300 B2
(45) Date of Patent: Nov. 28, 2017

(54) DISPLAY MODULE, DISPLAY APPARATUS FOR VEHICLE, AND METHOD OF MANUFACTURING THE SAME

(71) Applicant: SAMSUNG DISPLAY CO., LTD., Yongin-si, Gyeonggi-do (KR)

(72) Inventors: Jongsung Bae, Hwaseong-si (KR); Mugyeom Kim, Hwaseong-si (KR); Minsoo Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/093,321

(22) Filed: Apr. 7, 2016

(65) Prior Publication Data

US 2016/0358997 A1 Dec. 8, 2016

(30) Foreign Application Priority Data

Jun. 2, 2015 (KR) ........................ 10-2015-0078193

(51) Int. Cl.
*H01L 27/32* (2006.01)
*H01L 51/52* (2006.01)
*G02F 1/133* (2006.01)
(Continued)

(52) U.S. Cl.
CPC .......... *H01L 27/3293* (2013.01); *B60K 35/00* (2013.01); *B60R 21/2165* (2013.01);
(Continued)

(58) Field of Classification Search
CPC .................................................. H01L 27/3293
(Continued)

(56) References Cited

U.S. PATENT DOCUMENTS

| 5,558,364 A | 9/1996 | Davis |
| 2004/0008314 A1 | 1/2004 | Hayashi et al. |

(Continued)

FOREIGN PATENT DOCUMENTS

| JP | 2014-061849 A | 4/2014 |
| JP | 5594772 B2 | 8/2014 |

(Continued)

OTHER PUBLICATIONS

Extended European Search Report for corresponding European Application No. 16172605.4, European Search Report dated Mar. 1, 2017 and dated Mar. 10, 2017 (10 pgs.).

*Primary Examiner* — Moazzam Hossain
*Assistant Examiner* — Omar Mojaddedi
(74) *Attorney, Agent, or Firm* — Lewis Roca Rothgerber Christie LLP

(57) ABSTRACT

A display module includes a base substrate including an upper surface and a lower surface opposite the upper surface; a pixel layer facing the base substrate such that the upper surface of the base substrate is between the lower surface and the pixel layer, the pixel layer including a plurality of pixels; and a window member facing the base substrate such that the pixel layer is between the window member and the base substrate, the window member in an upper surface exposed to an outside thereof and a lower surface opposite the upper surface, and the upper surface of the window member and the lower surface of the base substrate include intaglio patterns, the intaglio patterns are overlapping with a dotted area when viewed in a plan view, and the display module is configured to be torn along the dotted area when a force is applied thereto.

18 Claims, 15 Drawing Sheets

(51) Int. Cl.
*B60K 35/00* (2006.01)
*B60R 21/2165* (2011.01)
*G02F 1/1335* (2006.01)
*G02F 1/1339* (2006.01)
*G02F 1/1343* (2006.01)
*G02F 1/1333* (2006.01)

(52) U.S. Cl.
CPC ........ *G02F 1/1339* (2013.01); *G02F 1/13439* (2013.01); *G02F 1/133512* (2013.01); *G02F 1/133514* (2013.01); *G02F 1/133528* (2013.01); *G02F 1/134363* (2013.01); *H01L 27/322* (2013.01); *H01L 27/3248* (2013.01); *H01L 27/3258* (2013.01); *H01L 27/3276* (2013.01); *H01L 51/524* (2013.01); *G02F 1/13338* (2013.01); *G02F 2001/133519* (2013.01); *G02F 2001/133531* (2013.01); *H01L 2227/323* (2013.01)

(58) Field of Classification Search
USPC .......................................................... 257/88
See application file for complete search history.

(56) References Cited

U.S. PATENT DOCUMENTS

| | | | |
|---|---|---|---|
| 2008/0203392 A1 | 8/2008 | Kim et al. | |
| 2009/0189373 A1* | 7/2009 | Schramm | B60K 35/00 280/731 |
| 2011/0006671 A1* | 1/2011 | Kwon | H01L 51/56 313/505 |
| 2012/0224133 A1* | 9/2012 | Makino | G02F 1/1339 349/153 |
| 2013/0344768 A1* | 12/2013 | Lee | G02F 1/1333 445/25 |
| 2014/0300090 A1 | 10/2014 | Pechnyk et al. | |
| 2015/0282259 A1* | 10/2015 | Yamada | H05B 33/04 313/512 |

FOREIGN PATENT DOCUMENTS

| | | |
|---|---|---|
| KR | 10-0722116 B1 | 5/2007 |
| WO | WO 2015/109216 A1 | 7/2015 |

* cited by examiner

DISPLAY MODULE, DISPLAY APPARATUS FOR VEHICLE, AND METHOD OF MANUFACTURING THE SAME

CROSS-REFERENCE TO RELATED APPLICATION

This application claims priority to and the benefit of Korean Patent Application No. 10-2015-0078193, filed in the Korean Intellectual Property Office on Jun. 2, 2015, the entire content of which is hereby incorporated by reference.

BACKGROUND

1. Field

Aspects of embodiments of the present disclosure relate to a display module, a display apparatus a vehicle, and a method of manufacturing the display module.

2. Description of the Related Art

In recent years, as the market demand for various display devices increasing, various flexible display devices, such as a curved display device, a rollable display device, a stretchable display device, etc., have been actively researched in addition to a flat panel display device. The flat panel display device and the flexible display devices are required to have high durability against external force.

SUMMARY

According to an aspect of the present disclosure, a display module is capable of being torn along a dotted line.

According to another aspect of the present disclosure, display apparatus for a vehicle is provided.

According to another aspect of the present disclosure, a method of manufacturing the display module is provided.

According to one or more embodiments of the present disclosure, a display module includes a base substrate, a pixel layer, and a window member. The base substrate includes an upper surface and a lower surface opposite the upper surface. The pixel layer is disposed to face the lower surface of the base substrate such that the upper surface of the base substrate is disposed between the lower surface and the pixel layer and includes a plurality of pixels. The window member is disposed to face the base substrate such that the pixel layer is disposed between the window member and the base substrate and includes are upper surface exposed to an outside thereof and a lower surface opposite the upper surface of the window member.

The upper surface of the window member and the lower surface of the base substrate include intaglio patterns, the intaglio patterns are disposed to overlap with a dotted area when viewed in a plan view, and the display module is configured to be torn along the dotted area when a force is applied thereto.

The intaglio patterns may be randomly disposed in the dotted area.

Each of the intaglio patterns may have a diameter from a few micrometers to hundreds of micrometers when viewed in a plan view.

The intaglio patterns may include an upper groove and lower groove. The upper groove may be formed in the upper surface of the window member and the lower groove may be formed in the lower surface of the base substrate.

The upper groove may be provided in a plural number, and any one upper groove the upper grooves may have a depth different from a depth of another upper groove of the upper grooves. The lower groove may be provided in a plural number, and any one lower groove of the lower grooves may have a depth different from a depth of another lower groove of the lower grooves.

The display module may be divided into a plurality of display panels, each configured to display an image, and a dummy part between the display panels, and the dotted area may be in the dummy part.

The intaglio patterns may further include a thru-hole penetrating through the base substrate, the pixel layer, and the window member.

The display module may be divided into a display area configured to display an age, and a non-display area adjacent to the display area, and the dotted area may cross the display area.

The upper groove and the lower groove may cover the pixel layer so as not to expose the pixel layer.

According to one or more embodiments of the present disclosure, a display apparatus of a vehicle including an area in which an airbag is embedded includes a base substrate, a pixel layer, and a window member. The base substrate includes an upper surface and a lower surface opposite the upper surface. The pixel layer is disposed to face the lower surface of the base substrate such that the upper surface of the base substrate is disposed between the lower surface and the pixel layer and includes a plurality of pixels. The window member is disposed to face the base substrate such that the pixel layer is disposed between the window member and the base substrate and includes an upper surface exposed to an outside thereof and a lower surface opposite the upper surface of the window member.

The upper surface of the window member and the lower surface of the base substrate include intaglio patterns, the intaglio patterns are disposed to overlap with a dotted area when viewed in a plan view, and the display module is configured to be torn along the dotted area by a force applied to the display module when the airbag is deployed.

The display apparatus of the vehicle may be divided into a plurality of display panels, each configured to display an image, and a dummy part between the display panels, and the dotted area may be in the dummy part.

The display apparatus of the vehicle may be divided into a display area configured to display an image, and a non-display area adjacent to the display area, and the dotted area may cross the display area.

According to one or more embodiments of the present disclosure, method of manufacturing a display module includes providing a display module including a base substrate, a pixel layer, and a window member, which are sequentially stacked one on another and including a dotted area defined therein when viewed in a plan view, irradiating a first femtosecond laser downward from above the window member to the dotted area of the display module, and irradiating a second femtosecond laser upward from below the base substrate to the dotted area display module.

The first femtosecond laser may be irradiated several times at different energy intensities, and the second femtosecond laser may be irradiated several times at different energy intensities.

The first femtosecond laser may be randomly irradiated to the dotted area several times, and the second femtosecond laser may be randomly irradiated to the dotted area several times.

According to the above, the display module and the display apparatus for the vehicle may be torn along the dotted area by the force or energy applied thereto from the outside of the display module and the display apparatus for the vehicle.

According to the manufacturing method of the display module, the display module configured to be torn along the dotted area by the force or energy applied thereto from the outside may be easily manufactured.

BRIEF DESCRIPTION OF THE DRAWINGS

The above and other aspects of the present disclosure will become readily apparent by reference to the following description of some exemplary embodiments when considered in conjunction with the accompanying drawings, wherein.

DETAILED DESCRIPTION

The following description with reference to the accompanying drawings is provided to assist in a comprehensive understanding of various embodiments of the present disclosure as defined by the claims and their equivalents. The description includes various details to assist in that understanding, but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness. The terms and words used in the following description and claims are not limited to the bibliographical meanings, but, are merely used to enable a clear and consistent understanding of the present disclosure. Accordingly, it should be apparent to those skilled art that the following description of various embodiments of the present disclosure is provided for the purpose of illustration and not for the purpose of limiting the present disclosure as defined by the appended claims and their equivalents.

Hereinafter, some exemplary embodiments of the present invention will be explained in detail with reference to the accompanying drawings.

Figure 1:
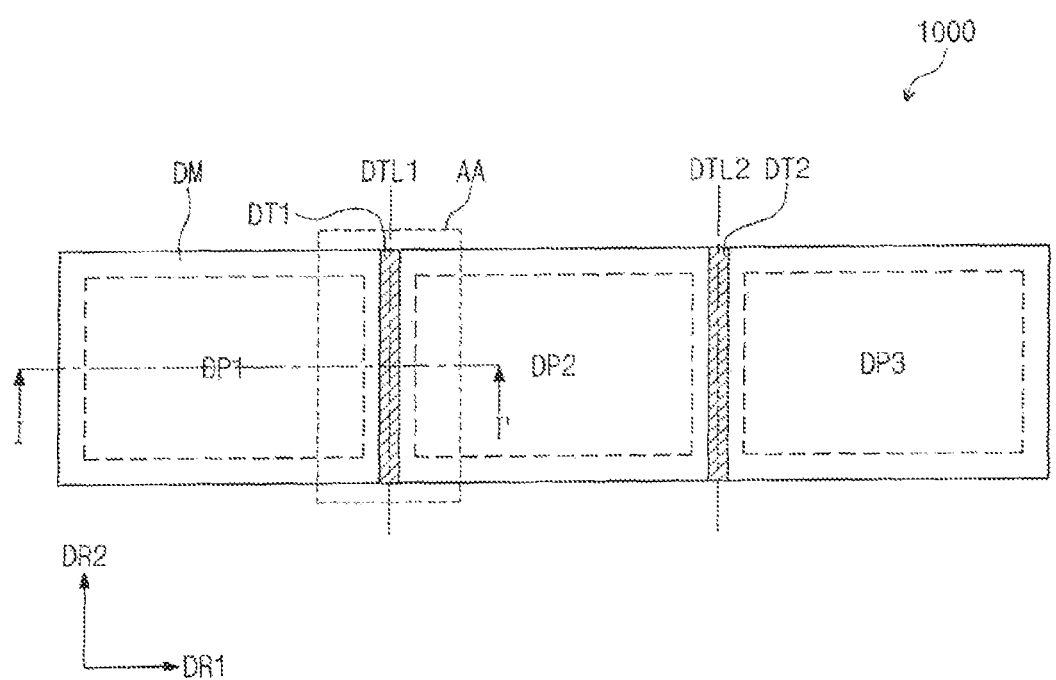
FIG. 1 is a plan view showing a display panel array according to an exemplary embodiment of the present disclosure.

FIG. 1 is a plan view showing a display panel array 1000 according to an exemplary embodiment of the present disclosure.

Referring to FIG. 1, the display panel array 1000 includes a plurality of display panels DP1, DP2, and DP3 and a dummy part DM. The display panel array 1000 shown in FIG. 1 may be a display module in which the display panels DP1, DP2, and DP3 are formed on a common substrate.

Each of the display panels DP1, DP2, and DP3 displays an image in response to signals applied thereto. Each of the display panels DP1, DP2, and DP3 may be, but is not limited to, an organic light emitting display panel, a liquid crystal display panel, a plasma display panel, an electrophoretic display panel, or an electrowetting display panel. Hereinafter, the organic light emitting display panel will be described as the display panels DP1, DP2, and DP3.

The display panels DP1, DP2, and DP3 and the dummy part DM may be flexible. Accordingly, the display panel array 1000 may be flexible.

The display panels DP1, DP2, and DP3 shown in FIG. 1 include first, second, and third display panels DP1, DP2, and DP3, but the number of the display panels DP1, DP2, and DP3 is not limited to three. That is, the display panel array 1000 may include four or more display panels.

The dummy part DM is disposed between the first, second, and third display panels DP1, DP2, and DP3. The dummy part DM is disposed adjacent to an edge of each of the first, second, and third display panels DP1, DP2, and DP3 to surround the first, second, and third display panels DP1, DP2, and DP3. The dummy part DM is finally removed in the manufacturing method of the organic light emitting display panel.

The dummy part DM covers dotted areas DT1 and DT2. The dotted areas DT1 and DT2 are disposed between the display panels DP1, DP2 and DP3. The dotted areas DT1 and DT2 are spaced apart from the display panels DP1, DP2, and DP3. In the present exemplary embodiment, the dotted areas DT1 and DT2 include first dotted area DT1 disposed between the first and second display panels DP1 and DP2 and a second dotted area DT2 disposed between the second and third display panels DP2 and DP3.

Dotted lines DTL1 and DTL2 are defined in the dotted areas DT1 and DT2. The dotted lines DTL1 and DTL2 may be imaginary lines designed to allow the display panel array 1000 to be partially torn. FIG. 1 shows a first dotted line DTL1 defined in the first dotted area DT1 and a second dotted line DTL2 defined the second dotted area DT2. The dotted areas DT1 and DT2 correspond to areas having predetermined margin in a first direction DR1 from the first and second dotted lines DTL1 and DTL2 and a direction opposite to the first direction DR1.

The display panels DP1, DP2, and DP3 are disposed adjacent to each other in the first direction DR1. The dotted lines DTL1 and DTL2 extend in a second direction DR2 crossing the first direction DR1. The dotted areas DT1 and DT2 extend in the second direction DR2 along the dotted lines DTL1 and DTL2.

Figure 2:
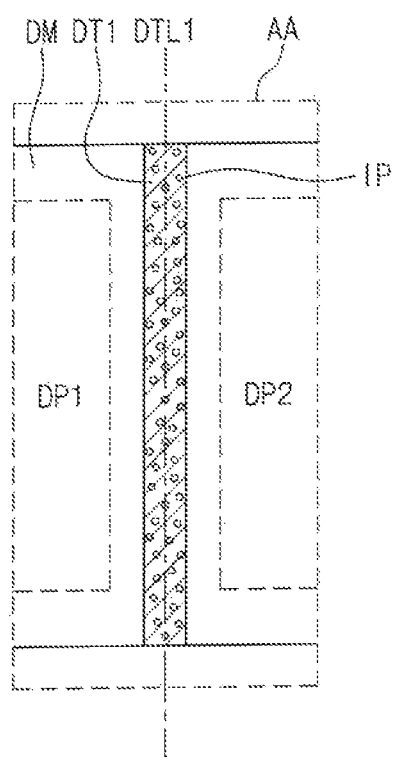
FIG. 2 is an enlarged plan view of the display panel array of FIG. 1 showing a region "AA" shown in FIG. 1.

FIG. 2 is an enlarged plan view of the display panel array of FIG. 1 showing region "AA" shown in FIG. 1

Referring to FIG. 2, the that dotted area DT1 include a plurality of intaglio patterns IP. The intaglio patterns IP are grooves, thru-holes, or a combination of grooves and thru-holes.

The intaglio patterns IP, in one embodiment, are randomly arranged in the first dotted area DT1.

The intaglio patterns IP may be formed by using a femtosecond laser. The femtosecond laser is a laser having a pulse width of femtosecond, i.e., about $10^{-15}$ seconds, and the femtosecond laser forms the intaglio patterns IP using high energy intensity, thereby minimizing or reducing damage to the display panel array 1000 when the intaglio patterns IP are formed.

Each of the intaglio patterns IP may have a diameter in a range from a few micrometers to hundreds of micrometers when viewed ire a plan view.

The second dotted area DT2 shown in FIG. 1 has substantially the same shape as that of the first dotted area DT1, and the intaglio patterns IP may be similarly ranged in the second dotted area DT2.

Figure 3:
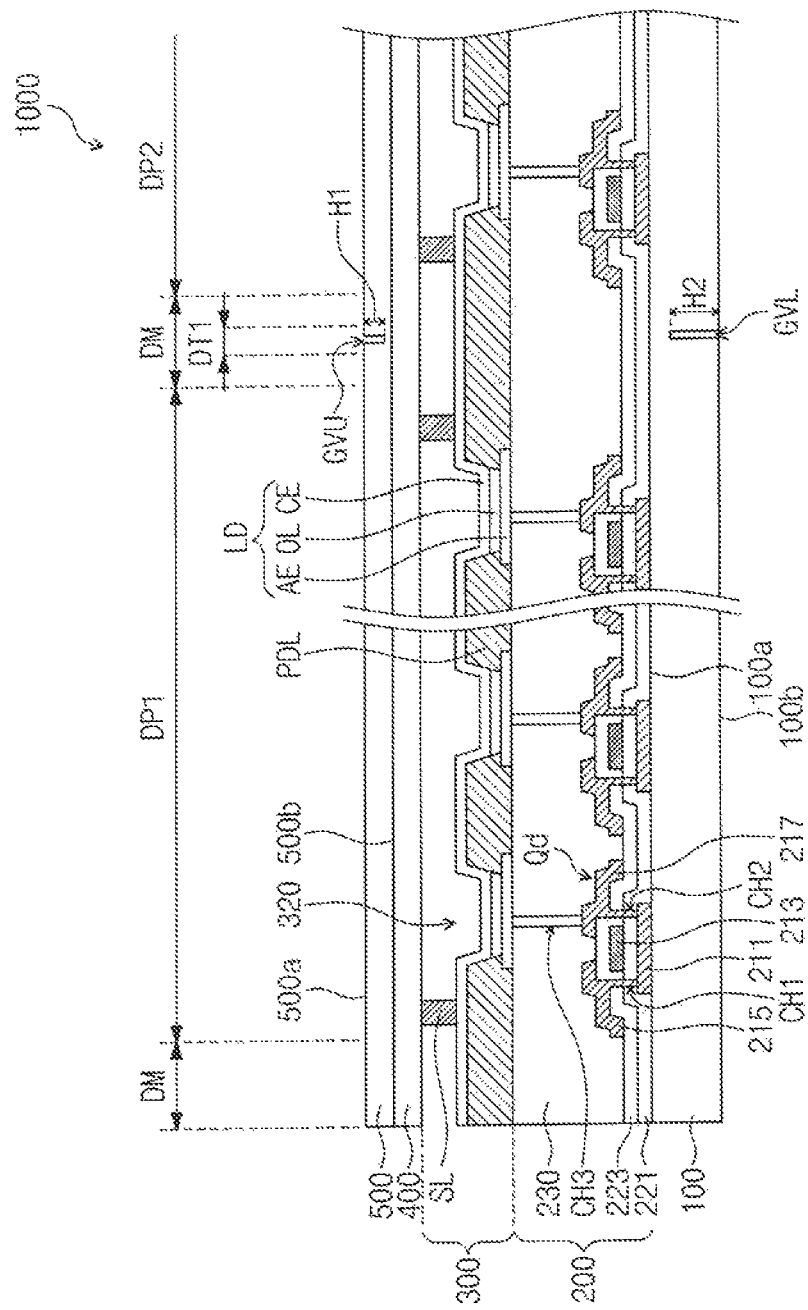
FIG. 3 is a cross-section view of the display panel array of FIG. 1, taken along the line I-I' of FIG. 1.

FIG. 3 is a cross-sectional view of the display panel array 1000, taken along the line I-I' of FIG. 1.

Referring to FIGS. 1 and 3, the display panel array 1000 includes a base substrate 100, a wiring layer 200, a pixel layer 300, an opposite layer 400 and a window member 500.

The base substrate 100 includes an upper surface 100a and a lower surface 100b facing the upper surface 100a. The lower surface 100b of the base substrate 100 corresponds to a lowermost surface of the display panel array 1000 and is exposed to the outside of the display panel array 1000.

The base substrate 100 may be, but is not limited to, flexible substrate and may include a plastic material having superior heat resistance and durability, e.g., polyethyleneetherphthalate, polyethylenenaphthalate, polycarbonate, polyarylate, polyetherimide, polyethersulfone, polyimide, etc., but is not limited thereto. That is, the base substrate 100 may include various materials, e.g., metal, glass, etc.

The wiring layer 200 is disposed on the base substrate 100. The wiring layer 200 includes signal lines and transistors to apply signals to the pixel layer 300. FIG. 3 shows one driving transistor Qd an on the transistors included in the wiring layer 200 as a representative example.

The driving transistor Qd includes an active layer 211, a gate electrode 213, a first transistor electrode 215, and a second transistor electrode 217.

The active layer 211 is disposed on the base substrate 100. The wiring layer 200 further include a first insulating layer 221 disposed between the active layer 211 and the gate electrode 213. The first insulating layer 221 insulates the active layer 211 from the gate electrode 213. The first and second transistor electrodes 215 and 217 ate disposed on the gate electrode 213. The wiring layer 200 further includes a second insulating layer 223 disposed between the gate electrode 213 and the first transistor electrode 215 and between the gate electrode 213 and the second transistor electrode 217. Each of the first and second transistor electrodes 215 and 217 is connected to the active layer 211 through respective contact holes CH1 and CH2 formed through the first and second insulating layers 221 and 223.

One electrode of the first and second transistor electrodes 215 and 217 serves as source electrode, and the other electrode of the first and second transistor electrodes 215 and 217 serves as a drain electrode.

The present exemplary embodiment is not limited to the structure of the driving transistor Qd shown in FIG. 3, and positions of the active layer 211, the gate electrode 213, the first transistor electrode 215, and the second transistor electrode 217 may be changed to various positions. For instance, the gate electrode 213 is disposed on the active layer 211 in shown FIG. 3, but the gate electrode 213 may be disposed under the active layer 211.

The wiring layer 200 further includes a protective layer 230 disposed on the first and second transistor electrodes 215 and 217.

Although not shown in the drawings, the signal lines included in the wiring layer 200 may be disposed on the same layer as the gate electrode 213, the first transistor electrode 215, and the second transistor electrode 217. In addition, although not shown in the drawings, the wiring layer 200 may further include a barrier layer (not shown) disposed on the upper surface 100a of the base substrate 100. The barrier layer (not shown) may prevent or substantially prevent foreign substances, such as moisture, etc., from infiltrating into the pixel layer 300 through the base substrate 100.

The pixel layer 300 includes a pixel definition layer PDL and organic light emitting devices LD.

The pixel definition layer PDL is disposed on the wiring layer 200 and exposes pixel areas In which the organic light emitting devices LD are disposed.

Each of the organic light emitting devices LD includes a first electrode AE, an organic layer OL, and a second electrode CE.

In the present exemplary embodiment, the first electrode AE may be an anode electrode or a positive electrode. The first electrode AE generates holes. The first electrode AE is disposed on the protective layer 230. The first electrode AE is connected to the second transistor electrode 217 through a contact hole CH3 formed through the protective layer 230.

The first electrode AE may be a transmissive electrode, a transflective electrode, or a reflective electrode. When the first electrode AE is the transmissive electrode, the first electrode AE may include a transparent metal oxide, e.g., indium tin oxide (ITO), indium zinc oxide (IZO) zinc oxide (ZnO), iridium tin zinc oxide (ITZO), etc. When the first electrode AE is the transflective electrode or the reflective electrode, the first electrode AE may include Ag, Mg, Al, Pt, Pd, Au, Ni, Nd, Ir, Cr, or an alloy thereof.

The first electrode AE may have a single-layer structure of the transparent metal oxide or metal or a multi-layer structure of layers. For instance, the first electrode AE may have a single-layer structure of ITO, Ag, or an alloy of metal, e.g., a mixture of Ag and Mg, a double-layer structure of ITO/Mg or ITO/MgF, or a triple-layer structure of ITO/Ag/ITO, but is not limited thereto.

In the present exemplary embodiment, the second electrode CE may be a cathode electrode or a negative electrode. The second electrode CE generates electrons. The second electrode CE is disposed on the pixel definition layer PDL and the first electrode AE.

The second electrode CE may be a transmissive electrode, a transflective electrode, or a reflective electrode. When the second electrode CE is the transmissive electrode, the second electrode CE may include Li, Ca, LiF/Ca, LiF/Al, Al, Mg, BaF, Ba, Ag, a compound thereof, or a mixture thereof, e.g., a mixture of Ag and Mg. The second electrode CE may include an auxiliary electrode. The auxiliary electrode includes a layer formed by depositing the above-mentioned materials towards the light emitting layer and a transparent conductive oxide formed on the layer, such as indium tin oxide, indium zinc oxide, zinc oxide, indium tin zinc oxide, Mo, Ti, etc. When the second electrode CE is the transflective electrode or the reflective electrode, the second electrode CE may include Ag, Mg, Al, Pt, Pd, Au, Ni, Nd, Ir, Cr, Li, Ca, LiF/Ca, LiF/Al, Mo, Ti, a compound thereof or a mixture thereof, e.g., a mixture of Ag and Mg. The second electrode CE may have a multi-layer structure of a reflective layer or a transflective layer and a transparent conductive layer formed of indium tin oxide, indium zinc oxide, zinc oxide, indium tin zinc oxide, etc.

When the organic light emitting device LD is a front surface light emitting type, the first electrode AE is the reflective electrode, and the second electrode CE is the transmissive or transflective electrode. When the organic light emitting device LD is a rear surface light emitting type, the first electrode AE is the transmissive or transflective electrode, and the second electrode CE is the reflective electrode. Different from FIG. 3, positions of the first and second electrode AE and CE may be changed with respect to each other.

The organic layer OL includes plurality of layers and includes an organic material.

The organic layer OL includes an organic light emitting layer EML including a low-molecular weight organic material or a high-molecular weight organic material. Holes and electrons are injected into the organic layer OL from the first electrode AE and the second electrode CE, respectively. The holes and electrons are recombined in the organic light emitting layer to generate excitons, and the organic light emitting layer emits a light by the excitons that return to a ground state from an excited state. The light emitted from the organic light emitting layer has an intensity depending on an output current flowing through an output terminal of the driving transistor Qd.

Although not shown in the drawings, the organic layer OL may further include a hole transport region HTR and an electron transport region ETR.

The pixel layer 300 may further include a sealing member SL. The sealing member SL is overlapped with each of the display panels DP1, DP2, and DP3 and disposed along an edge of each of the display panels DP1, DP2, and DP3.

The sealing member SL is attached to the opposite layer 400. The sealing member SL prevents or substantially prevents the organic light emitting device LD from being exposed to moisture or air in cooperation with the opposite layer 400.

An inner space 320 defined by the opposite layer 400, the second electrode CE, and the sealing ember SL may be maintained in a vacuum state, but is not limited thereto. For instance, the inner space 320 may be filled with nitrogen ($N_2$) or a filling member of an insulating material.

The opposite layer 400 is disposed on the pixel layer 300. In the display panel array 1000 according to the present exemplary embodiment, the opposite layer 400 has a function of the seating layer since each of the display panels DP1, DP2, and DP3 is the organic light emitting display panel. The opposite layer 400 prevents or substantially prevents the organic light emitting device LD from being exposed to moisture or air.

The opposite layer 400 may have a double-layer structure of an organic layer and an inorganic layer, but is not limited thereto. The opposite layer 400 may be a substrate formed of glass or plastic.

The window member 500 is disposed on the opposite layer 400. The window member 500 is disposed to face the base substrate 100 to allow the pixel layer 300 to be disposed between the window member 500 and the base substrate 100. The window member 500 includes an upper surface 500a and a lower surface 500b facing the rapper surface 500a. The upper surface 500a of the window member 500 corresponds to an uppermost of the display panel array 1000 and is exposed to the outside of the display panel array 1000.

Referring to FIGS. 1 to 3, the intaglio patterns ilk include an upper groove GVU and a lower groove GVL. FIG. 3 shows the intaglio pattern IP having a smallest depth.

The upper groove GVU is formed on the upper surface 500a of the window member 500. In the present exemplary embodiment, the upper groove GVU may he formed not to penetrate through the window member 500. The upper groove GVU has a first depth H1 smaller than a thickness of the window member 500. In one embodiment, when viewed in a plan view, the upper groove GVU is randomly arranged in the dotted areas DT1 and DT2.

The lower groove GVL is formed the lower surface 100b of the base substrate 100. In the present exemplary embodiment, the lower groove GVL may be formed not to penetrate through the base substrate 100. The lower groove GVL has a second depth H2 smaller than a thickness of the base substrate 100. In one embodiment, when viewed in a plan view, the lower groove GVL is randomly arranged in the dotted areas DT1 and DT2.

Since the upper groove GVU and the lower groove GVL are formed to overlap with the dotted areas DT1 and DT2, strength of the dotted areas DT1 and DT2 is weaker than that of the other areas. Accordingly, when energy applied to the display panel array 1000 under a specific condition, the display panel array 1000 may be torn along the dotted areas DT1 and DT2. Here, the specific condition includes not only a case that a physical force, e.g., a tensile force, a compressive force, a bending force, a twist force, etc., is applied to the display panel array 1000, but also a case that heat is applied to the display panel array 1000.

Since the display panel array 1000 is torn along the dotted areas DT1 and DT2, the display panels DP1, DP2, and DP3 are safely separated from each other. The organic light emitting devices LD of each of the display panels DP1, DP2, and DP3 are protected from external moisture and air by the sealing member SL and the opposite layer 400.

Figure 4:
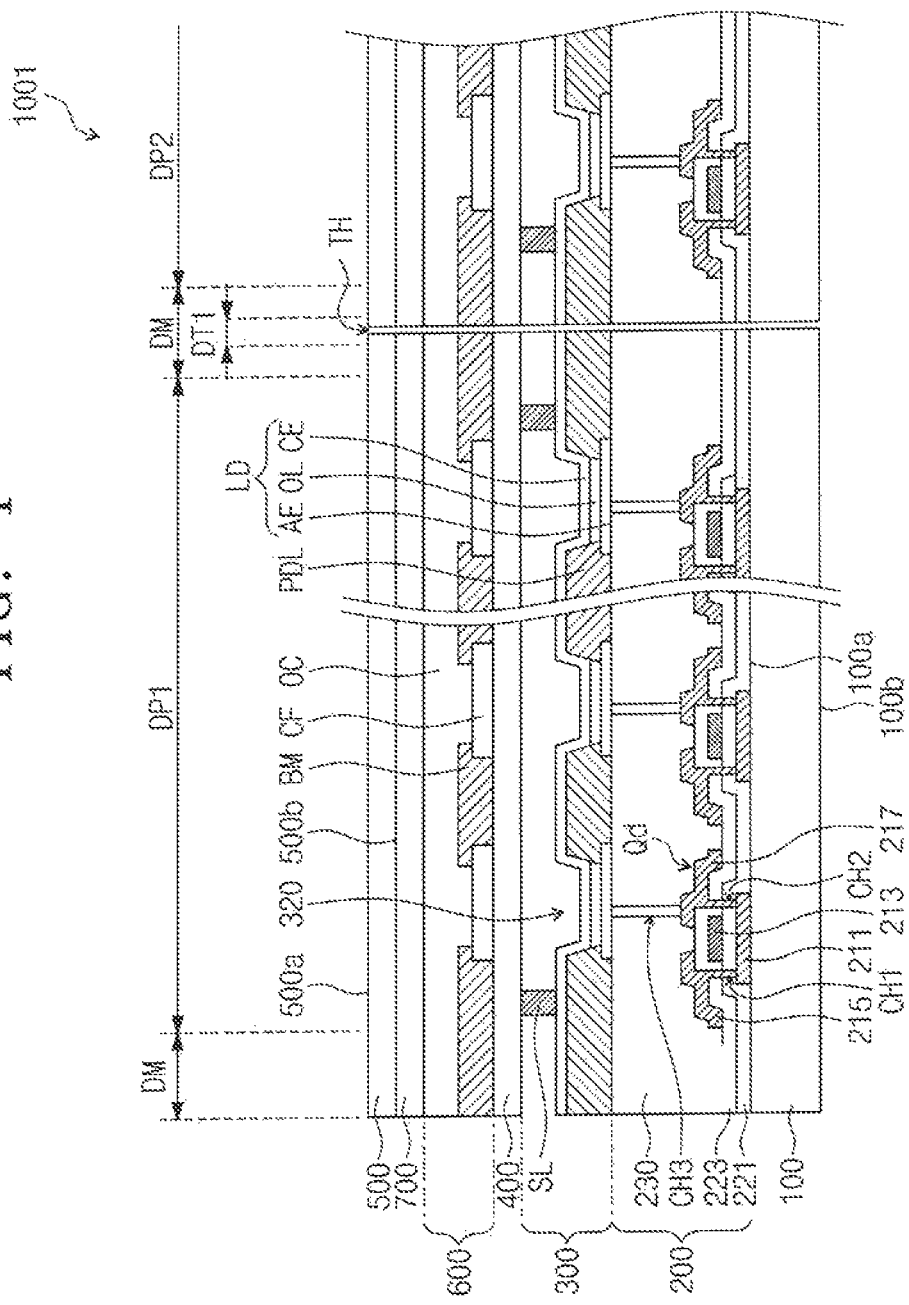
FIG. 4 is a cross-sectional view of a display panel array according to a exemplary embodiment of the present disclosure, taken along the line I-I' of FIG. 1.

FIG. 4 is a cross-sectional view of a display panel array 1001 according to another exemplary embodiment of the present disclosure, taken along the line I-I' of FIG. 1.

Referring to FIGS. 1, 2, and 4, the display panel array 1001 may further include a color filter layer 600 and a touch panel 700.

The color filter layer 600 is disposed between the opposite layer 400 and the window member 500.

The color filter layer 600 includes a color filter CF, a black matrix BM, and an overcoat OC.

The color filter CF is disposed to overlap with the organic light emitting devices LD. The color filter CF includes at least one of a red color filter, a green color filter, and a blue color filter.

The black matrix BM is disposed between the color filters CF adjacent to each other. The black matrix BM is disposed to overlap with the pixel definition layer PDL.

The overcoat OC is disposed on the black matrix BM and the color filter CF. The overcoat OC compensates for a step difference occurring between the black matrix BM and the color filter CF, and thus an upper surface of the overcoat OC is planarized. The overcoat OC includes an insulating material, but the overcoat OC may be omitted according to embodiments.

The color filter layer 600 prevents or substantially prevents an external light from being reflected. The color filter layer 600 may be used instead of a circular polarizing film. Therefore, the display panel array 1001 according to the present exemplary embodiment does not need to include the circular polarizing film. Since the circular polarizing film has a high percentage of elongation, the display panels DP1, DP2, and DP2 may not be easily torn even though the intaglio patterns IP are formed. The display panel array 1001 according to the present exemplary embodiment includes the color filter layer 600 instead of the circular polarizing film, and thus a brittle fracture more easily occurs than when the display panel array includes the circular polarizing film.

The touch panel 700 is disposed between the color filter layer 600 the window member 500. When a touch event occurs on the upper surface 500a of the window member 500, the touch panel 700 obtains a touch coordinate of the touch event.

FIG. 4 shows the intaglio pattern IP having a largest depth. The display panel array 1001 further includes the color filter layer 600 and the touch panel 700 compared to the display panel array 1000 shown in FIG. 3, and a thru-hole TH may be formed through the base substrate 100, the wiring layer 200, the pixel layer 300, the opposite layer 400, the window member 500, the color filter layer 600, and the touch panel 700.

Similar to the upper groove GVU and the lower groove GVL shown in FIG. 3, the thru-hole TH is disposed to overlap with the dotted areas DT1 and DT2, and the strength of the dotted areas DT1 and DT2 is weaker than that of the other areas. The display panel array 1001 is torn along the dotted areas DT1 and DT2, and thus the display panels DP1, DP2, and DP3 are safely separated from each other.

Figure 5:
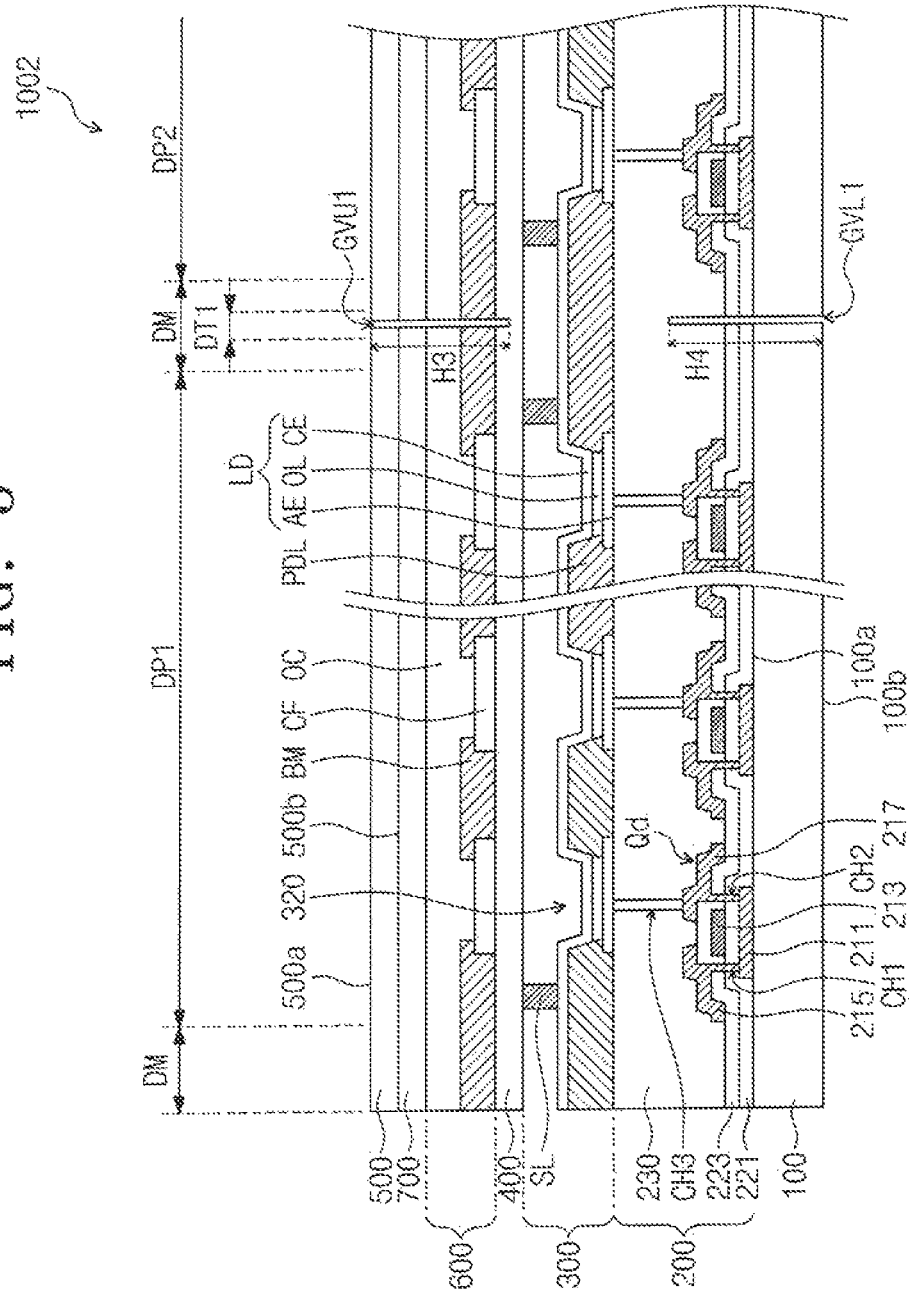
FIG. 5 is a cross-sectional view of a display panel array according to another exemplary embodiment of the present disclosure, taken along the line I-I' of FIG. 1.

FIG. 5 is a cross-sectional view of a display panel array 1002 according to another exemplary embodiment of the present disclosure, taken along the I-I' of FIG. 1.

Referring to FIGS. 1, 2, and 5, the display panel array 1002 includes the base substrate 100, the wiring layer 200, the pixel layer 300, the opposite layer 400, the window member 500, the color filter layer 600, and the touch panel 700. For convenience of explanation, further details of elements of the display panel array 1002 will be omitted.

The intaglio patterns IP of the display panel array 1002 shown in FIG. 5 include an upper groove GVU1 and a lower groove GVL1.

The upper groove GVU1 penetrates through at least the window member 500. In FIG. 5, the upper groove GVU1 penetrates through the window member 500, the touch panel 700, and the color filter layer 500 to expose the opposite layer 400. The upper groove GVU1 has a third depth H3. The third depth H3 is greater than a sum of thicknesses of the window member 500, the touch panel 700, and the color filter layer 600. The third depth H3 is smaller than thicknesses of the window member 500, the touch panel 700, the color filter layer 600, and the opposite layer 400. The upper surface of the opposite layer 400 is not planarized due to the upper groove GVU1.

The lower groove GVL1 penetrates through at least the base substrate 100. In FIG. 5, the lower groove GVL1 penetrates through the base substrate 100 to expose the wiring layer 200. The lower groove GVL1 has a fourth depth H4 greater than the thickness of the base substrate 100. The fourth depth H4 is smaller than a sum of thicknesses of the base substrate 100 and the wiring layer 200. The lower surface of the wiring layer 200 is not planarized due to the lower groove GVL1.

However, the depths of the upper and lower grooves GVU1 and GVL1 are not limited thereto. That is, the depths of the upper and lower grooves GVU1 and GVL1 may be variously set such that the display panel array 1002 is easily torn.

Referring to FIGS. 1 to 5, the intaglio patterns IP may have different depths. For instance, a portion of the intaglio patterns IP serves as the upper grooves GVU and GVU1, another portion of the intaglio patterns IP serves as the lower grooves GVL and GVL1, and the other portion of the intaglio patterns IP serves as the thru-hole TH. In this case, the upper grooves GVU and GVU1 may have different depths and the lower grooves GVL and GVL1 may have different depths.

Figure 6:
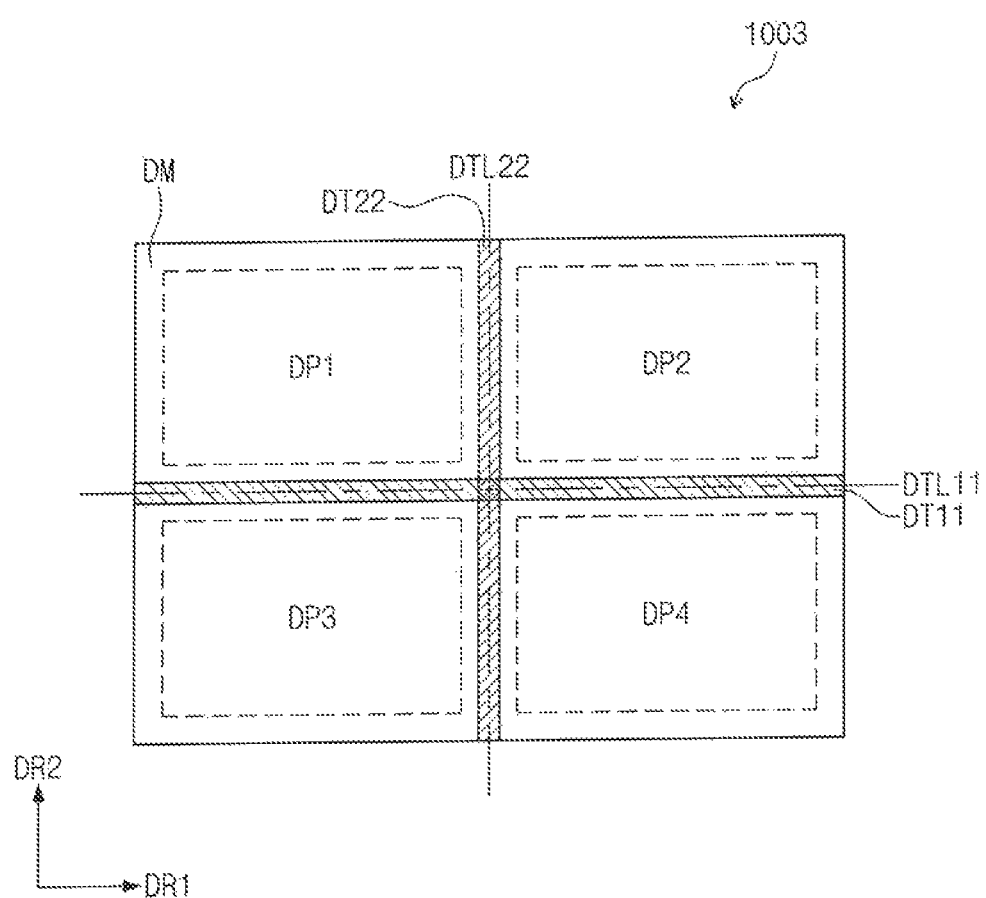
FIG. 6 is a plan view showing another example of a display panel array according to the present disclosure.

FIG. 6 is a plan view showing another example of a display panel array according to the present disclosure.

Positions of display panels DP1, DP2, DP3, and DP4 arranged in a display panel array 1003 may be variously set. Different features between the display panel array 1003 shown in FIG. 6 and the display panel array 1000 shown in FIG. 1 will be mainly described.

The display panel array 1003 includes the display panels DP1 to DP4 and a dummy part DM.

The display panels DP1 to DP4 are arranged in matrix form. In FIG. 6 the first to fourth display panels DP1 to DP4 are arranged in two rows by two columns.

The dummy part DM covers dotted areas DT11 and DT22. The dotted areas DT11 and DT22 are disposed between the display panels DP1 to DP4. The dotted areas DT11 and DT22 are spaced apart from the display panels DP1 to DP4.

The dotted areas DT11 and DT22 include a first dotted area DT11 and a second dotted area DT22. The first and second dotted areas DT11 and DT22 extend in different directions from each other.

The first dotted area DT11 is disposed between the first display panel DP1 and the third display panel DP3 and between the second display panel DP2 and the fourth display panel DP4. The first dotted area DT11 extends in a first direction DR1. A first dotted line DTL11 is defined in the first dotted area DT11. The display panel array 1003 is torn along the first dotted line DTL11.

The second dotted area DT22 is disposed between the first display panel DP1 and the second display panel DP2 and between the third display panel DP3 and the fourth display panel DP4. The second dotted area DT22 extends in a second direction DR2. A second dotted line DTL22 is defined in the second dotted area DT22. The display panel array 1003 is torn along the second dotted line DTL22.

Figure 7:
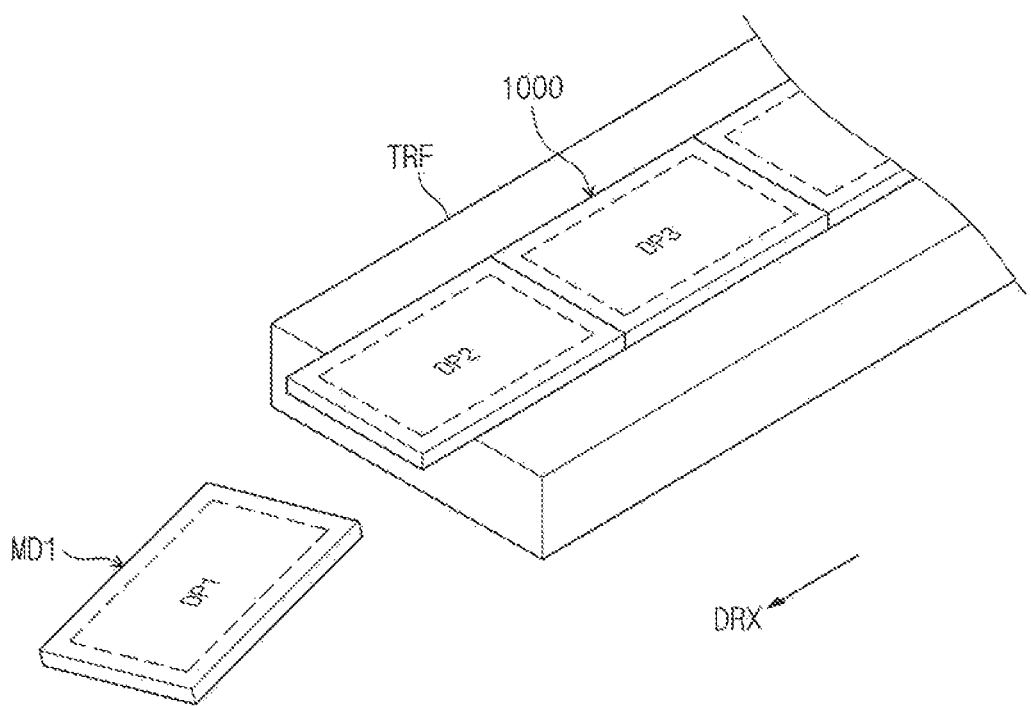
FIG. 7 is a perspective view showing the display panel array of FIG. 1.

FIG. 7 is a perspective view showing the display panel array of FIG. 1.

When a process of forming the display panels DP1, DP2, and DP3 is completed the display panel array 1000 including the display panels DP1, DP2, and DP3 is transferred onto a transfer part TRF along a transfer direction DRX. The transfer part TRF may be, but is not limited to, a transfer line or a transfer roller. When the display panel array 1000 is applied with an external force while being transferred, a module MD1 including the first display panel DP1 may be torn from the other part. Then, the torn module MD1 advances to a following process and the first display panel DP1 is separated from the torn module MD1.

Figure 8:
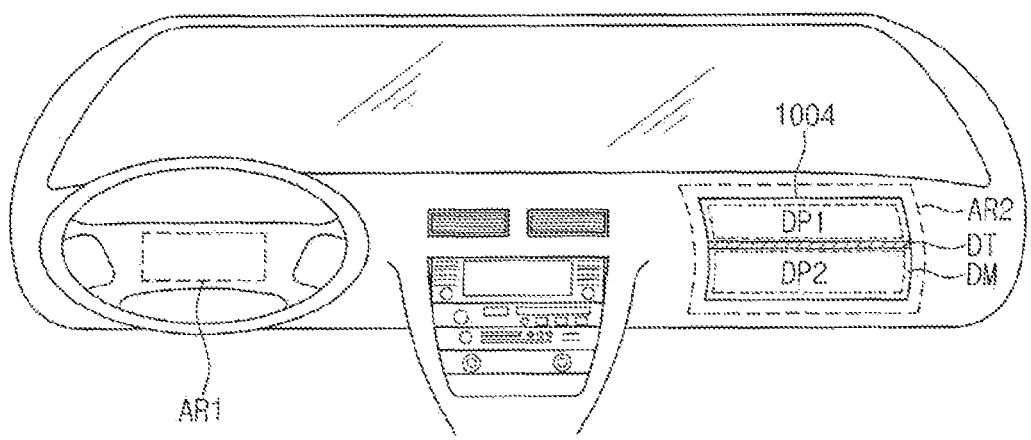
FIG. 8 is a view showing another example of a display panel array according to the present disclosure.

FIG. 8 is a view showing another example of a display panel array according to the present disclosure.

As shown in FIG. 8, a display panel array 1004 may be attached to an attachment target inside a vehicle. Since the display panel array 1004 is flexible, the display panel array 1004 may be attached to the attachment target of the vehicle even though the portion of the vehicle has a curved shape.

The attachment target may be at any of various positions in the vehicle, but the display panel array 1004 is disposed at a position overlapped with a position in which an airbag device is embedded. For instance, the display panel array 1004 may be attached to a center area AR1 of a steering wheel or a dashboard AR2. FIG. 8 shows the display panel array 1004 attached to the dashboard AR2.

The display panel array 1004 includes first and second display panels DP1 and DP2 and a dummy part DM disposed between the first and second display panels DP1 and DP2. The dummy part DM includes a dotted area DT. In FIG. 8, the first display panel DP1 is disposed closer to a front window compared to the second display panel DP2 and the dotted area DT extends in a horizontal direction.

When an impact exceeding a certain value (e.g., a predetermined value) applied to the vehicle, the airbag embedded in the dashboard AR2 is deployed. The deployed airbag applies a physical impact exceeding a certain value (e.g., a predetermined value) to the display panel array 1004, and the display panel array 1004 is torn along the dotted area DT.

When the display panel array 1004 is or not easily torn apart, the airbag may not be normally deployed. According to the display panel array 1004 according to the present exemplary embodiment, the display panel array 1004 is torn by the impact applied thereto when the airbag is deployed, and thus the airbag is normally deployed, thereby protecting a passenger seated in the passenger seat. In addition, since the first and second display panels DP1 and DP2 are independent display modules, the first and second display panels DP1 and DP2 may be independently used even though the first and second display panels DP1 and DP2 are separated from each other.

Figure 9:
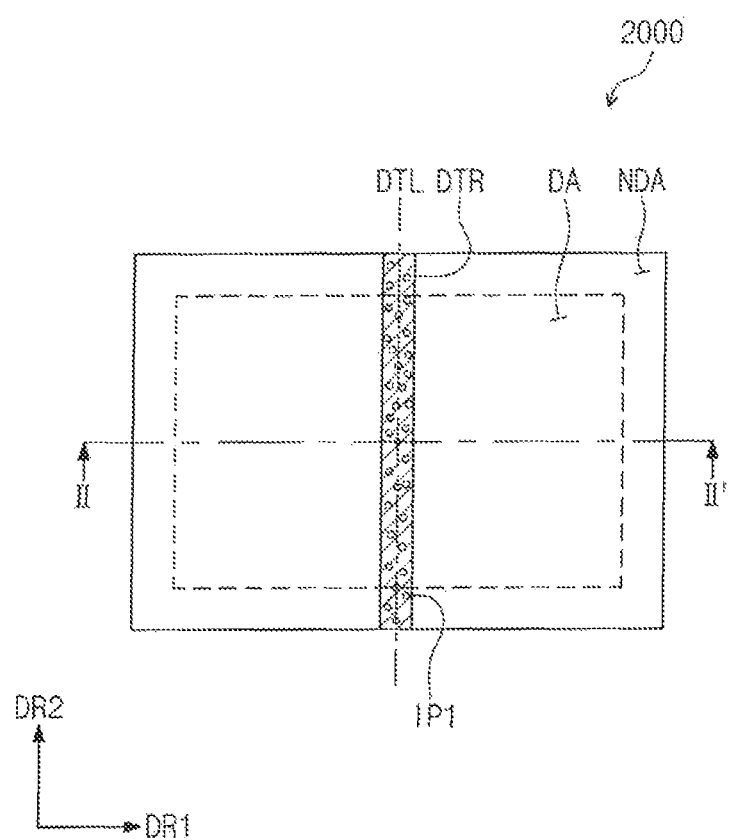
FIG. 9 is a plan view showing a display panel according to another exemplary embodiment of the present disclosure.

FIG. 9 is a plan view showing a display panel 2000 according to another exemplary embodiment of the present disclosure.

Referring to FIG. 9 the display panel 2000 may be one independent display module displaying an image in response to signals applied thereto. The display panel 2000 includes a display area DA and a non-display area NDA. The display area DA displays the image, and the non-display area NDA disposed adjacent to the display area DA does not display the image. As shown in FIG. 9, the non-display area NDA surrounds the display area DA.

The display panel 2000 includes a dotted area DTR. The dotted area DTR crosses the display area DA along a direction. The dotted area DTR is overlapped with the display area DA and the non-display area NDA. In the present exemplary embodiment, the dotted area DTR extends in a second direction DR2 as shown in FIG. 9.

A dotted line DTL is defined in the dotted area DTR. The dotted line DTL may be an imaginary line designed to allow the display panel 2000 to be torn. The dotted line DTL extends in the second direction DR2 as shown in FIG. 9.

The dotted area DTR has a predetermined margin in a first direction DR1 and a direction opposite to the first direction DR1 with respect to the dotted line DTL.

Intaglio patterns IP1 are defined in the dotted area DTR. The intaglio patterns IP1 may be grooves and may have different depths.

The intaglio patterns IP1 may be formed by using a femtosecond laser. The femtosecond laser is a laser having a pulse with of femtosecond about $10^{-15}$ seconds, and the femtosecond laser forms the intaglio patterns IP using high energy intensity thereby minimizing or reducing damage to the display panel 2000 when the intaglio patterns IP1 are formed.

Each of the intaglio patterns IP1 may have a diameter in a range from a few micrometers to hundreds of micrometers when viewed in a plan view. Each intaglio pattern IP1 has a diameter smaller than a vision and resolution power of human eyes. Accordingly, the user does not distinguish a difference in luminous characteristics between the image displayed in the display area DA overlapped with the dotted area DTR and the image displayed in the display area DA not overlapped with the dotted area DTR.

Figure 10:
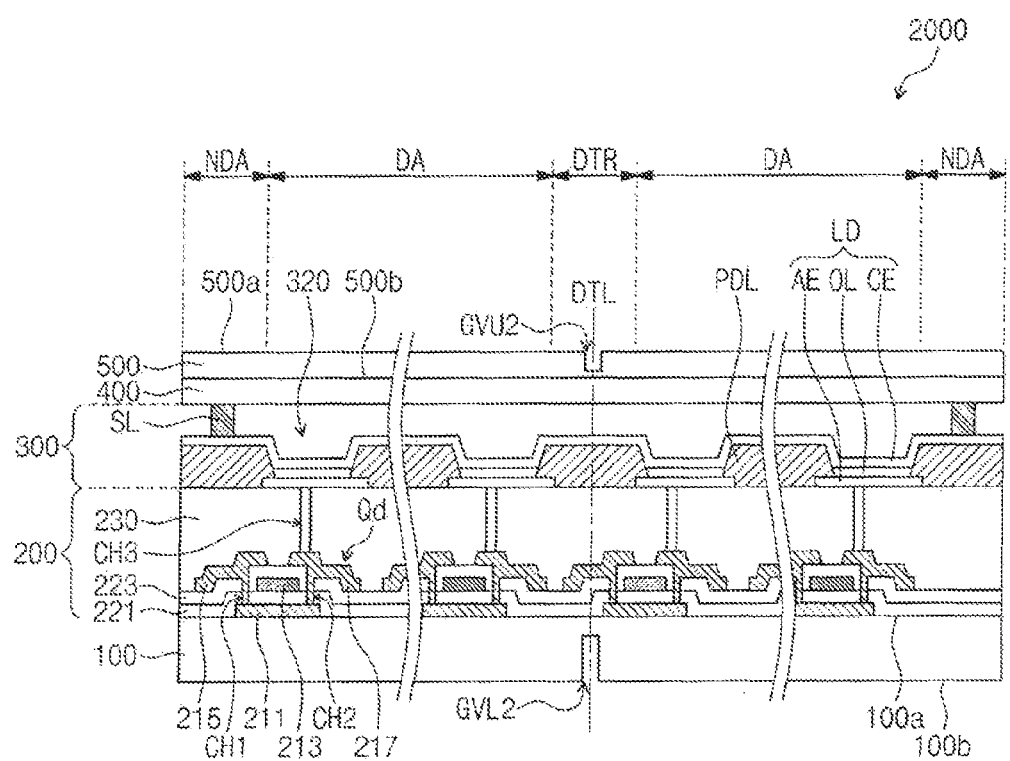
FIG. 10 is a cross-sectional view of the display panel array of FIG. 9, taken along the line II-II' of FIG. 9.

FIG. 10 is a cross-sectional view of the display panel array 2000, taken along the line II-II' of FIG. 9.

Referring to FIGS. 9 and 10, the display panel 2000 includes the base substrate 100, the wiring layer 200, the pixel layer 300, the opposite layer 400, and the window member 500. In FIG. 10, the same reference numerals denote the same elements described above with respect to FIG. 3, and thus further detailed descriptions of the same elements will be omitted.

The intaglio patterns IP1 include an upper groove GVU2 and a lower groove GVL2.

The upper move GVU2 is formed on the upper surface 500$a$ of the window member 500. In the present exemplary embodiment, the upper groove GVU2 may not penetrate through the window member 500. When viewed in a plan view, the upper groove GVU2 may be randomly arranged in the dotted area DTR.

The lower groove GVL2 is formed on the lower surface 100$b$ of the base substrate 100. In the present exemplary embodiment, the lower groove GVL2 may not penetrate through the base substrate 100. When viewed in a plan view, the lower groove GVL2 may be randomly arranged in the dotted area DTR.

Although not shown in the drawings the dotted area DTR may be overlapped with the organic light emitting devices LD.

Since the upper groove GVU2 and the lower groove GVL2 are formed to overlap with the dotted area DTR, strength of the dotted area DTR is weaker than that of the other areas. Therefore, when energy is applied to the display panel 2000 under a specific condition, the display panel 2000 may be torn along the dotted area DTR. Here, the specific condition includes not only a case that a physical force, e.g., a tensile force, a compressive force, a bending force, a twist force, etc., is applied to the display panel 2000, but also a case that heat is applied to the display panel 2000.

The display panel 2000 is damaged after being torn along the dotted area DTR, and thus the display panel 2000 may not display the image anymore. The display panel 2000 according to the present exemplary embodiment may be easily torn along the dotted area DTR.

Figure 11:
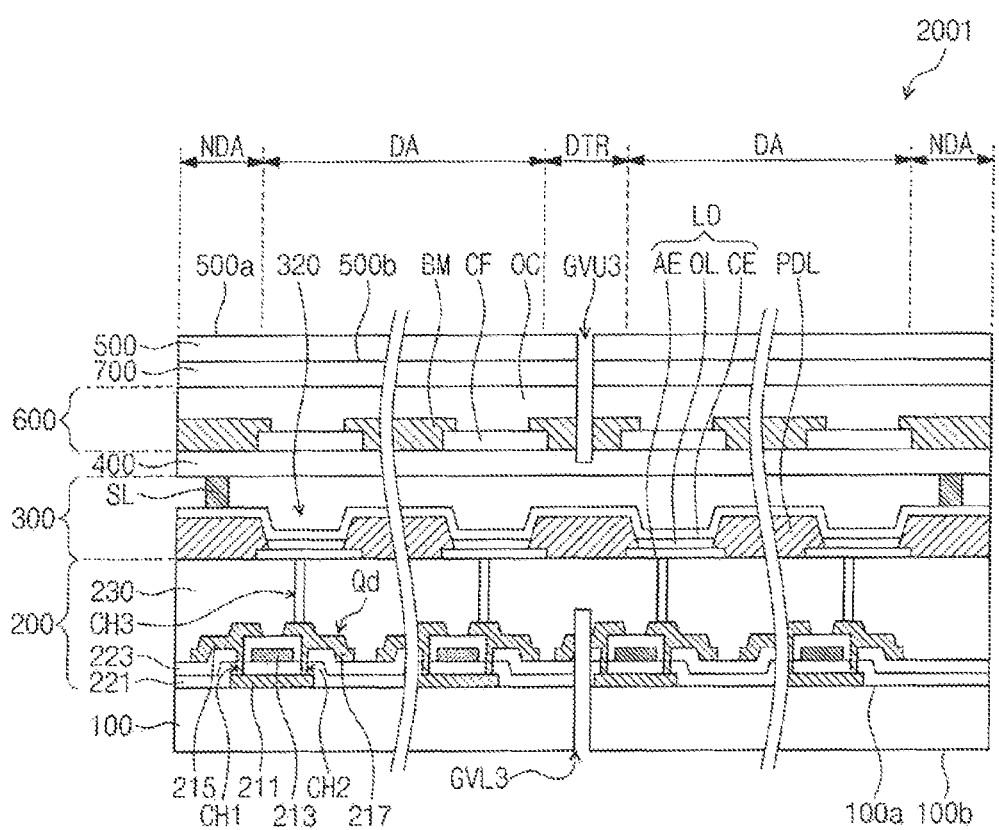
FIG. 11 is a cross-sectional view of a display panel array according to another exemplary embodiment of the present disclosure, taken along the line II-II' of FIG. 9.

FIG. 11 is a cross-sectional view of a display panel array 2001 according to another exemplary embodiment of the present disclosure taken, along the line II-II' of FIG. 9.

Referring to FIGS. 9 and 11, the display panel 2001 further includes the color filter layer 600 and the touch panel 700. In FIG. 11, the same reference numerals denote the same elements described above with respect to FIG. 4, and thus further detailed descriptions of the same elements will be omitted.

The intaglio patterns IP1 include an upper groove GVU3 and a lower groove GVL3.

The upper groove GVU3 may penetrate through at least the window member 500. As shown in FIG. 11, the upper groove GVU3 penetrates through the window member 500, the touch panel 700, and the color filter layer 600 to expose the appeal e layer 400. The upper surface of the opposite layer 400 is not planarized due to the upper groove GVU3.

When the upper groove GVU3 penetrates through the opposite layer 400, the pixel layer 300 overlapped with the dotted area DTR is damaged since the pixel layer 300 overlapped with the dotted area DTR is exposed. Thus, the upper groove GVU3 does not penetrate through the opposite layer 400, and the pixel layer 300 is not posed even though the upper groove GVU3 is formed.

The lower groove GVL3 penetrates through at least the base substrate 100. As shown in FIG. 11, the lower groove GVL3 penetrates through the base substrate 100 to expose the wiring layer 200. The lower surface of the wiring layer 200 is not planarized due to the lower groove GVL3.

When the lower groove GVL3 penetrates through the wing layer 200, the pixel layer 300 overlapped with the dotted area DTR is damaged since the pixel layer 300 overlapped with the dotted area DTR is exposed. Accordingly, the lower groove GVL3 does not penetrate through the wiring layer 200, and the pixel layer 300 is not exposed even though the lower groove GVL3 is formed.

However, the depth of the upper and lower grooves GVU3 and GVL3 is not limited thereto. The depth of the upper and lower grooves GVU3 and GVL3 may be variably set such that the display panel 2001 is torn due to the energy applied thereto as long as the pixel layer 300 is not exposed.

Figure 12:
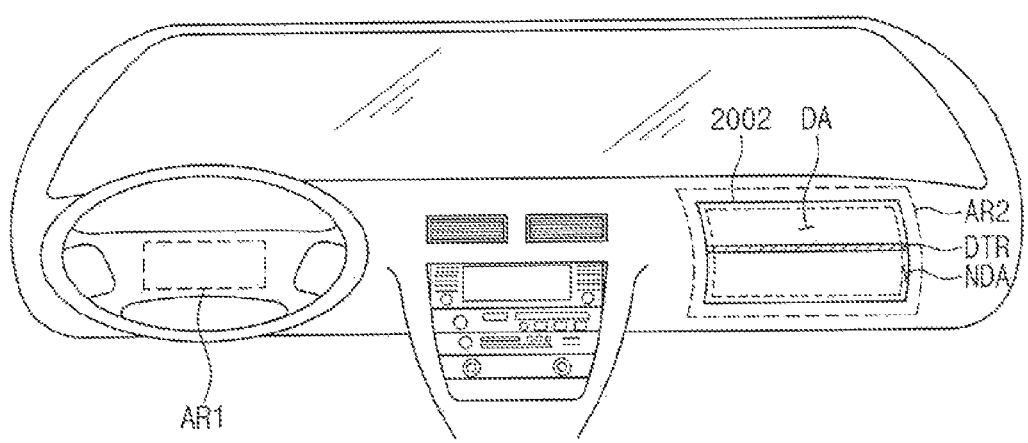
FIG. 12 is a view showing another example of a display panel array according to the present disclosure.

FIG. 12 is a view showing another example of a display panel array according to the present disclosure.

As shown in FIG. 12, a display panel 2002 may be attached to an attachment target inside a vehicle. Since the display panel 2002 is flexible, the display panel 2002 may be attached to the attachment target of the vehicle even though the portion of the vehicle has a curved shape.

The attachment target may be at any of various positions in the vehicle, but the display panel 2002 is disposed at a position overlapped with a position in which an airbag device is embedded. For instance, the display panel 2002 may be attached to the center area AR1 of a steering wheel or the dashboard AR2. FIG. 12 shows the display panel 2002 attached to the dashboard AR2.

The dotted area DTR of the display panel 2002 is overlapped with the display area DA and the non-display area NDA. FIG. 12 shows the dotted area DTR crossing the display panel 2002 along a horizontal direction.

When an impact exceeding a certain value (e.g. a predetermined value) is applied to the vehicle, the airbag embedded in the dashboard AR2 is deployed. The deployed airbag applies a physical impact exceeding a certain value (e.g., a predetermined value) to the display panel 2002 and the display panel 2002 is torn along the dotted area DTR.

When the display panel array 1004 is not easily torn apart, the airbag may not be normally deployed. According to the display panel 2002 according to the present exemplary embodiment, the display panel 2002 is torn by the impact applied thereto when the airbag is deployed, and thus the airbag is normally deployed. As a result, a passenger seated in the passenger seat is protected.

Figure 13:
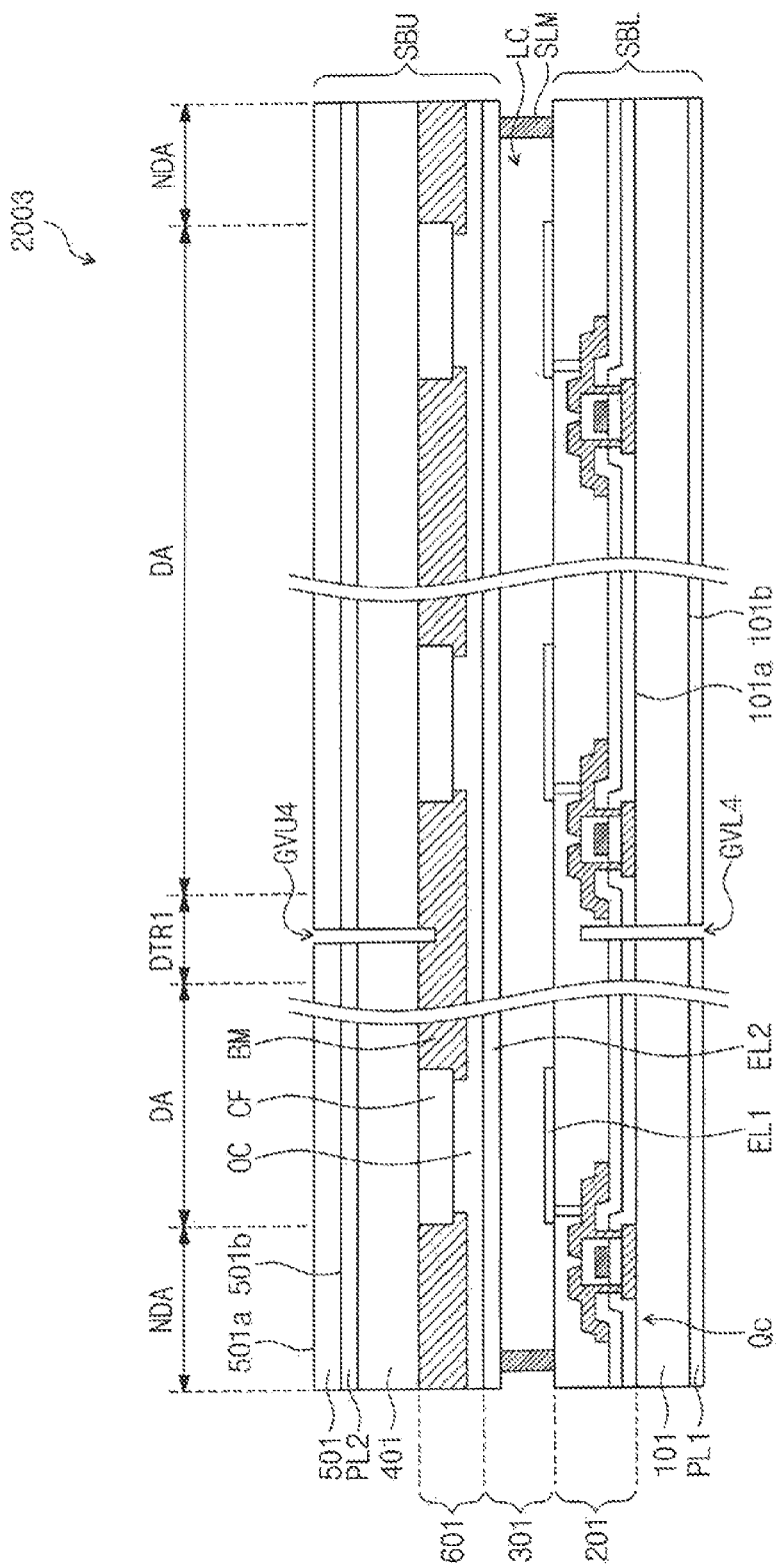
FIG. 13 is a cross-sectional view showing a display panel according to another exemplary embodiment of the present disclosure.

FIG. 13 is cross-sectional view showing a display panel 2003 according to an exemplary embodiment of the present disclosure. The display panel 2003 shown in FIG. 13 may be, but is not limited to, a liquid crystal display panel.

The display panel 2003 includes a base substrate 101, a wiring layer 201, a pixel layer 301, an opposite layer 401, a color filter layer 601, and a window member 501.

The base substrate 101 includes an upper surface 101a and a lower surface 101b facing the upper surface 101a. The base substrate 101 may include glass or plastic.

The wiring layer 201 is disposed on the base substrate 101. The wiring layer 201 includes signal lines and transistors to apply signals to the pixel layer 301. FIG. 13 shows one transistor Qc among the transistors included in the wiring layer 201 as a representative example.

The pixel layer 301 includes pixel electrode EL1, a liquid crystal layer LC, and a common electrode EL2.

The pixel electrode EL1 is disposed on the wiring layer 201. The pixel electrode EL1 is connected to the transistor Qc to receive a pixel voltage.

The common electrode EL2 receives a common voltage. The common electrode EL2 is disposed to face the pixel electrode EL1 to allow the liquid crystal layer LC to be disposed between the common electrode EL2 and the pixel electrode EL1, but is not limited thereto. In a structure that the pixel electrode EL1 and the common electrode EL2 form a horizontal electric field, the common electrode EL2 is disposed between the pixel electrode EL1 and the liquid crystal layer LC, or the pixel electrode EL1 is disposed between the liquid crystal layer LC and the common electrode EL2.

Each of the pixel electrode EL1 and the common electrode EL2 may have a multi-layer structure of transparent conductive layers, such as indium tin oxide, indium zinc oxide, zinc oxide, indium tin zinc oxide, etc.

The liquid crystal layer LC includes liquid crystal molecules and an arrangement of the liquid crystal molecules is changed in accordance with the electric field formed by the pixel electrode EL1 and the common electrode EL2.

The pixel layer 301 further includes a sealing member SLM. The display panel 2003 is divided into an upper substrate SBU and a lower substrate SBL as viewed relative to the sealing member SLM. The upper substrate SBU includes elements disposed above the sealing member SLM and the lower substrate SBL includes elements disposed under the sealing member SLM.

The upper substrate SBU and the lower substrate SBL are attached to each other by the sealing member SLM, and thus the liquid crystal layer LC is sealed. The sealing member SLM is provided along an edge of the display panel 2003.

The opposite layer 401 is disposed above the pixel layer 301. The opposite layer 401 may include glass or plastic.

The color filter layer 601 is disposed between the opposite layer 401 and the pixel layer 301.

The color filter layer 601 includes a color filter CF, a black matrix BM, and an overcoat OC.

The color filter CF is disposed to overlap with the pixel electrode EL1. The color filter CF includes at least one of a red color filter, a green color filter, and a blue color filter.

The black matrix BM is disposed between the color filters CF adjacent to each other.

The overcoat OC is disposed on the black matrix BM and the color filter CF. The overcoat OC compensates for a step difference occurring between the black matrix BM and the color filter CF. The overcoat OC includes an insulating material, but the overcoat OC may be omitted according to embodiments.

The window member 501 is disposed above the opposite layer 401. The window member 501 is disposed to face the base substrate 101 such that the pixel layer 301 is disposed between the base substrate 101 and the window member 501. The window member 501 includes an upper surface 501a and a lower surface 501b facing the upper surface 501a. The upper surface 501a of the window member 501 may be an uppermost surface of the display panel 2003 and exposed to the outside of the display panel 2003.

The display panel 2003 further includes first and second polarization plates PL1 and PL2.

The first polarization plate PL1 is disposed on the lower surface 101b of the base substrate 101. The second polarization plate PL2 is disposed between the opposite layer 401 and the window member 501. The first polarization plate PL1 has a transmission axis substantially perpendicular to a transmission axis of the second polarization plate PL2.

The display panel 2003 includes a dotted area DTR1. The dotted area DTR1 crosses the display area DA along one direction as the display panel 2000 shown in FIGS. 9 and 10, but is not limited thereto. In a display panel array including liquid crystal display panels as shown in FIG. 13, the dotted area may be disposed between the display panels as shown in FIGS. 1 and 2.

The dotted area DTR1 includes a plurality of intaglio patterns formed therein. The intaglio patterns may be grooves, thru-holes, or a combination of the grooves and thru-holes.

The intaglio patterns include an upper groove GVU4 and a lower groove GVL4.

The upper groove GVU4 is formed on the upper surface 501a of the window member 501. The upper groove GVU4 sequentially penetrates through one or more of the window member 501, the first polarization plate PL1, and the opposite layer 401. In the present exemplary embodiment, the upper groove GVU4 penetrates through the window member 501, the first polarization plate PL1, and the opposite layer 401 to expose the color filter layer 601 as shown in FIG. 13. The black matrix BM of the color filter layer 601 is exposed due to the upper groove GVU4. The upper groove GVU4 does not penetrate through the color filter layer 601. Accordingly, the pixel layer 301 is not exposed even though the upper groove GVU4 is formed.

The lower groove GVL4 is formed on the lower surface 101b of the base substrate 101. The lower groove GVL4 penetrates the base substrate 101. In the present exemplary embodiment, the lower groove GVL4 penetrates through the base substrate 101 to expose the wiring layer 201 as shown in FIG. 13. The lower surface 101b may not be planarized due to the lower groove GVL4.

The display panel 2003 is torn along the dotted area DTR1 under a specific condition in which the energy is applied to the display panel 2003.

Figure 14:
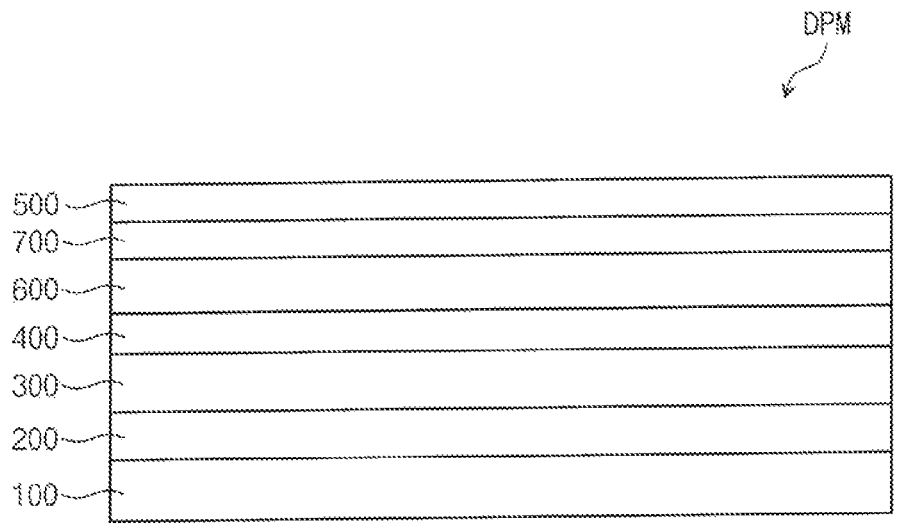
FIGS. 14 to 16 are schematic views showing a manufacturing method of a display panel array according to an embodiment of the present disclosure.
Figure 15:
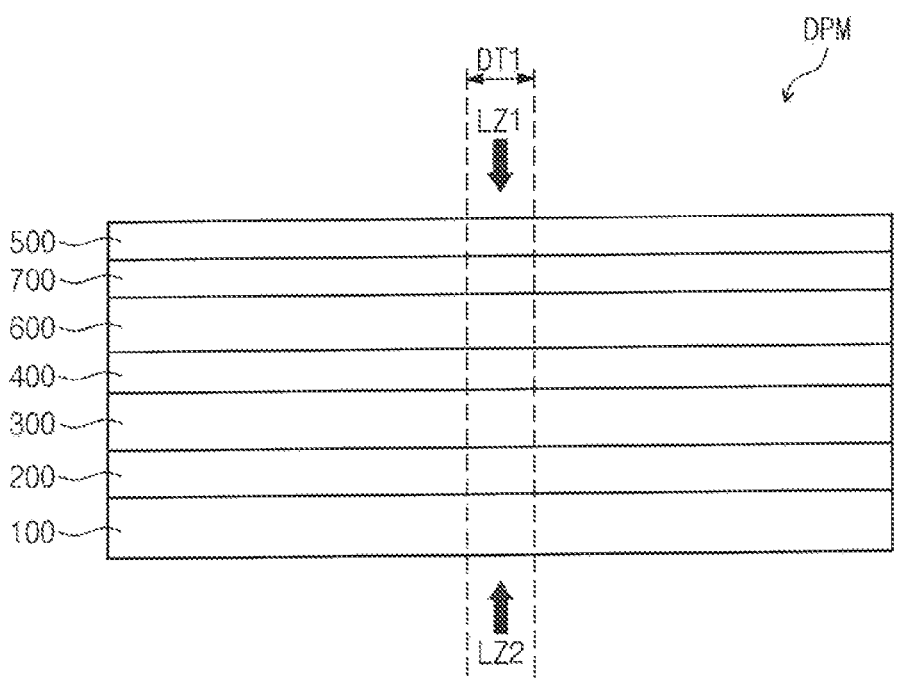
Figure 16:
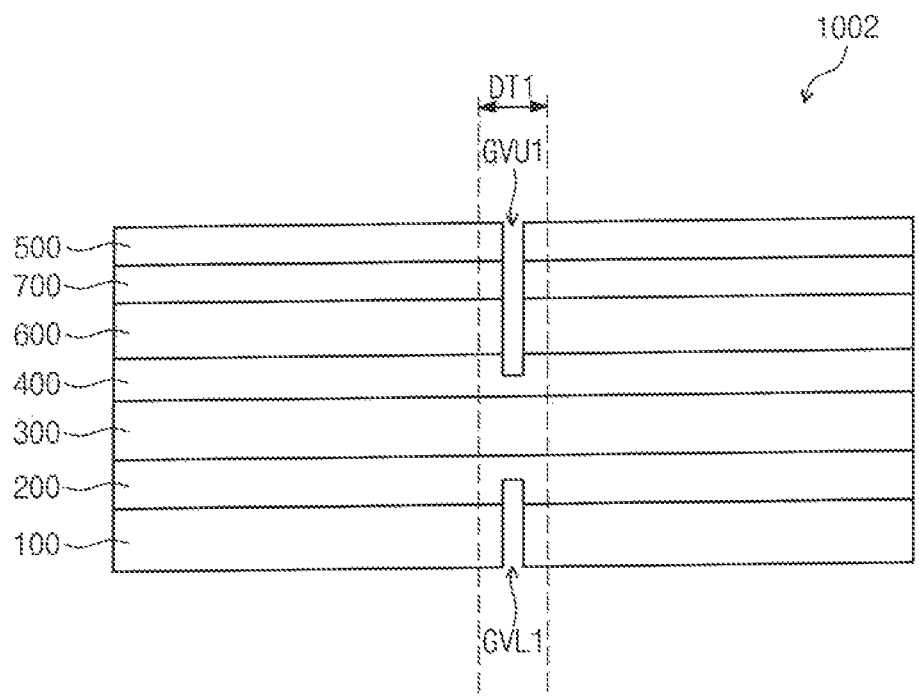

FIGS. 14 to 16 are schematic views showing a manufacturing method of a display panel array, such as the display panel array shown in FIGS. 1 to 5.

Referring to FIGS. 1, 5, and 14, the wiring layer 200, the pixel layer 300, the opposite layer 400, the color filter layer 600, the touch panel 700, and the window member 500 are sequentially formed on the base substrate 100. Accordingly, the display module DPM is formed. Further detailed descriptions of the base substrate 100, the wiring layer 200, the pixel layer 300, the opposite layer 400, the color filter layer 600, the touch panel 700, and the window member 500 will be omitted.

Referring to FIG. 15, in one embodiment, a femtosecond laser is irradiated to overlap with the dotted areas DT1 and DT2. In one embodiment, a first femtosecond laser LZ1 is irradiated downward from above the window member 500. The first femtosecond laser LZ1 may be randomly irradiated to the dotted areas DT1 and DT2 several times. The first femtosecond laser LZ1 may be irradiated several times at different energy intensities such that the intaglio patterns formed by the first femtosecond laser LZ1 have different depths.

Then, a second femtosecond laser LZ2 is irradiated upward from under the base substrate 100. The second femtosecond laser 122 may be randomly irradiated to the dotted areas DT1 and DT2 several times. The second femtosecond laser LZ2 may be irradiated several times at different energy intensities such that the intaglio patterns formed by the second femtosecond laser LZ2 have different depths. The irradiation order of the first and second femtosecond lasers LZ1 and LZ2 may be changed.

The first and second femtosecond lasers LZ1 and LZ2 are lasers having a pulse width of femtosecond, i.e., about $10^{-15}$ seconds, and the first and second femtosecond lasers LZ1 and LZ2 form the intaglio patterns using high energy intensity, thereby minimizing or reducing damage to the display panel array 1002 when the intaglio patterns are formed.

Referring to FIG. 16, the first femtosecond laser LZ1 forms the upper groove GVU1 on the upper surface of the window member 500 and the second femtosecond laser LZ2 forms the lower groove GVL1 on the lower surface of the base substrate 100. The depth of the upper and lower grooves GVU1 and GVL1 may be changed by controlling the intensity of the energy of the first and second femtosecond lasers LZ1 and LZ2. Since the display panel array 1002 is processed by using the first and second femtosecond lasers LZ1 and LZ2 before heat caused by the first and second femtosecond lasers LZ1 and LZ2 is transferred to the surrounding, the display panel array 1002 may be prevented from being damaged. In addition, the first and second femtosecond lasers LZ1 and LZ2 may perform an ultrafine process, and thus each of the upper groove GVU1 and the lower groove GVL1 may have a diameter in a range from a few micrometers to hundreds of micrometers when viewed in a plan view.

While this invention has been described it connection with what is presently considered to be some practical exemplary embodiments, it is to be understood that the invention is not limited to the disclosed embodiments, but, on the contrary, is intended to cover various modifications and equivalent arrangements included within the spirit and scope of the appended claims and equivalents thereof.

What is claimed is:

1. A display module comprising:
a base substrate comprising an upper surface and a lower surface opposite the upper surface;
a pixel layer facing the base substrate such that the upper surface of the base substrate is between the lower surface and the pixel layer, the pixel layer comprising a plurality of pixels; and
a window member facing the base substrate such that the pixel layer is between the window member and the base substrate, the window member comprising an upper surface exposed to an outside thereof and a lower surface opposite the upper surface of the window member, wherein the upper surface of the window member and the lower surface of the base substrate comprise intaglio patterns, the intaglio patterns are overlapping with a dotted area when viewed in a plan view, the dotted area extending along a direction of a line, the intaglio patterns including plural intaglio patterns that are adjacent and spaced apart from each other along the direction of the line, and the display module is configured to be torn along the dotted area when a force is applied thereto.

2. The display module of claim 1, wherein the intaglio patterns are randomly disposed in the dotted area.

3. The display module of claim 1, wherein each of the intaglio patterns has a diameter from a few micrometers to hundreds of micrometers when viewed in a plan view.

4. The display module of claim 1, wherein the intaglio patterns comprise:
an upper groove formed in the upper surface of the window member; and
a lower groove formed in the lower surface of the base substrate.

5. The display module of claim 4, wherein the upper groove is provided in a plural number, any one upper groove of the upper grooves has a depth different from a depth of another upper groove of the upper grooves, the lower groove is provided in a plural number, and any one lower groove of the lower grooves has a depth different from a depth of another lower groove of the lower grooves.

6. The display module of claim 4, wherein the display module is divided into a plurality of display panels, each configured to display an image, and a dummy part between the display panels, and the dotted area is in the dummy part.

7. The display module of claim 6, wherein the intaglio patterns further comprise a thru-hole penetrating through the base substrate, the pixel layer, and the window member.

8. The display module of claim 6, further comprising:
a wiring layer between the base substrate and the pixel layer to apply a signal to the pixel layer;
an opposite layer between the pixel layer and the window member to protect the pixel layer; and
a color filter layer between the opposite layer and the window member.

9. The display module of claim 8, wherein the upper groove sequentially penetrates through at least one of the window member, the color filter layer, the opposite layer, the pixel layer, the wiring layer, and the base substrate, and the lower groove sequentially penetrates through at least one of the base substrate, the wiring layer, the pixel layer, the opposite layer, the color filter layer, and the window member.

10. A display module comprising:
a base substrate comprising an upper surface and a lower surface opposite the upper surface;
a pixel layer facing the base substrate such that the upper surface of the base substrate is between the lower surface and the pixel layer, the pixel layer comprising a plurality of pixels; and
a window member facing the base substrate such that the pixel layer is between the window member and the base substrate, the window member comprising an upper surface exposed to an outside thereof and a lower surface opposite the upper surface of the window member, wherein the upper surface of the window member and the lower surface of the base substrate comprise intaglio patterns, the intaglio patterns are overlapping with a dotted area when viewed in a plan view, and the display module is configured to be torn along the dotted area when a force is applied thereto, wherein the display module is divided into a display area displaying an image and a non-display area disposed adjacent to the display area and the dotted area is disposed to cross the display area.

11. The display module of claim 10, wherein the upper groove and the lower groove cover the pixel layer so as not to expose the pixel layer.

12. The display module of claim 10, further comprising:
a wiring layer between the base substrate and the pixel layer to apply a signal o the pixel layer;
an opposite layer between the pixel layer and the window member to protect the pixel layer; and
a color filter layer between the opposite layer and the window member.

13. The display module of claim 12, wherein the upper groove sequentially penetrates through at least one of the window member and the color filter layer, and the lower groove sequentially penetrates through at least one of the base substrate and the wiring layer.

14. A display apparatus of a vehicle including an area in which an airbag is embedded, the display apparatus comprising:
a base substrate comprising an upper surface and a lower surface opposite the upper surface;
a pixel layer facing the base substrate such that the upper surface of the base substrate is between the lower surface and the pixel layer, the pixel layer comprising a plurality of pixels; and
a window member facing the base substrate such that the pixel layer is between the window member and the base substrate, the window member comprising an upper surface exposed to an outside thereof and a lower surface opposite the upper surface of the window member, wherein the upper surface of the window member and the lower surface of the base substrate comprise intaglio patterns, the intaglio patterns are overlapping with a dotted area when viewed in a plan view, and the display apparatus is configured to be torn along the dotted area by a force applied to the display apparatus when the airbag is deployed.

15. The display apparatus of claim 14, wherein the display apparatus is divided into a plurality of display panels, each configured to display an image, and a dummy part between the display panels, and the dotted area is in the dummy part.

16. The display apparatus of claim 14, wherein the display apparatus is divided into a display area configured to display an image, and a non-display area adjacent to the display area, and the dotted area crosses the display area.

17. The display module of claim 10, wherein the intaglio patterns are overlapping with the display area.

18. The display apparatus of claim 16, wherein the intaglio patterns are overlapping with the display area.

* * * * *